United States Patent
Zhao et al.

(10) Patent No.: US 8,938,697 B1
(45) Date of Patent: Jan. 20, 2015

(54) METHOD OF PERFORMING OPTICAL PROXIMITY CORRECTION FOR PREPARING MASK PROJECTED ONTO WAFER BY PHOTOLITHOGRAPHY

(71) Applicant: United Microelectronics Corp., Hsin-Chu (TW)

(72) Inventors: Jie Zhao, Singapore (SG); Chia-Ping Chen, Taoyuan County (TW); Ching-Shu Lo, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/010,554

(22) Filed: Aug. 27, 2013

(51) Int. Cl.
  *G06F 17/50* (2006.01)
(52) U.S. Cl.
  CPC .................................. *G06F 17/5068* (2013.01)
  USPC ........................................................... 716/53
(58) Field of Classification Search
  CPC ........................ H01L 27/0207; G06F 17/5068
  USPC ........................................................... 716/53
  See application file for complete search history.

(56) References Cited

U.S. PATENT DOCUMENTS

| | | | |
|---|---|---|---|
| 5,682,323 A | 10/1997 | Pasch | |
| 5,705,301 A | 1/1998 | Garza | |
| 5,723,233 A | 3/1998 | Garza | |
| 5,900,338 A | 5/1999 | Garza | |
| 6,753,115 B2 * | 6/2004 | Zhang et al. | 430/5 |
| 7,065,738 B1 * | 6/2006 | Kim | 716/53 |
| 7,325,225 B2 * | 1/2008 | Tanaka et al. | 716/53 |
| 8,151,221 B2 * | 4/2012 | Huang et al. | 716/53 |
| 8,321,820 B2 * | 11/2012 | Huang et al. | 716/53 |
| 8,434,034 B2 * | 4/2013 | Wei et al. | 716/55 |
| 2003/0118917 A1 * | 6/2003 | Zhang et al. | 430/5 |
| 2007/0079278 A1 * | 4/2007 | Tanaka et al. | 716/21 |
| 2008/0286698 A1 * | 11/2008 | Zhuang et al. | 430/323 |
| 2011/0084312 A1 * | 4/2011 | Quandt et al. | 257/202 |
| 2011/0271237 A1 * | 11/2011 | Huang et al. | 716/50 |
| 2012/0192123 A1 * | 7/2012 | Huang et al. | 716/53 |
| 2013/0007423 A1 * | 1/2013 | Burcea et al. | 712/239 |

* cited by examiner

*Primary Examiner* — Suchin Parihar
(74) *Attorney, Agent, or Firm* — Winston Hsu; Scott Margo

(57) ABSTRACT

A method of performing optical proximity correction for preparing a mask projected onto a wafer by photolithography includes the following steps. An integrated circuit layout design comprising a first feature and a second feature is obtained, wherein the first feature overlaps a first boundary of two structures in the wafer. An edge of the first feature close to the second feature pertaining to a specific trend section of an experimental chart having trend sections is recognized. An optical proximity correction value is evaluated for the edge through a computer system by a rule corresponding to the specific trend section. The layout design is compensated with the optical proximity correction value.

22 Claims, 4 Drawing Sheets

METHOD OF PERFORMING OPTICAL PROXIMITY CORRECTION FOR PREPARING MASK PROJECTED ONTO WAFER BY PHOTOLITHOGRAPHY

BACKGROUND OF THE INVENTION

1. Field of the Invention

The present invention relates generally to a method of performing optical proximity correction for preparing a mask projected onto a wafer by photolithography, and more specifically to a method of performing optical proximity correction for preparing a mask projected onto a wafer by photolithography that prepares the mask overlapping a boundary of two structures in the wafer.

2. Description of the Prior Art

The minimum feature sizes of integrated circuits (ICs) have been shrinking for years. Along with this size reduction, various process limitations have made IC fabrication more difficult. One area of the fabrication technology in which such limitations have emerged is photolithography. In the semiconductor fabrication process, lithography processes are important steps to transfer integrated circuit layouts to semiconductor wafers. Generally, a wafer manufacturing company designs a mask layout according to an integrated circuit layout; and then fabricates a mask having the designed mask layout. Afterwards, by way of lithography processes, the pattern on the mask (i.e. the mask pattern) is transferred to a photoresist layer on the surface of a semiconductor wafer with a specific scale.

More precisely, photolithography involves selectively exposing regions of a photoresist coated wafer to a radiation pattern, and then developing the exposed photoresist in order to selectively protect regions of wafer layers such as regions of a substrate, polysilicon or a dielectric.

A component of photolithographic apparatus is a mask which includes a pattern corresponding to features of one layer in an IC design. Such mask typically includes a transparent glass plate covered with a patterned light blocking material such as chromium. The mask is placed between a radiation source producing radiation of a pre-selected wavelength and a focusing lens. A photoresist covered wafer is placed beneath the focusing lens. When the radiation from the radiation source is directed onto the mask, light passes through the glass, i.e. regions having no chromium patterns, and is projected onto the photoresist covered wafer. In this manner, an image of the mask is transferred to the photoresist.

The photoresist is provided as a thin layer of radiation-sensitive material that is spin-coated over the entire wafer surface. The resist material is classified as either positive or negative depending on how it responds to light radiation. Positive photoresist becomes soluble and is thus more easily removed in a development process when exposed to radiation. Negative photoresist, in contrast, becomes less soluble when exposed to radiation. Consequently, a developed negative photoresist contains a pattern corresponding to the transparent regions of the mask.

As the complexity and the integration rate of the integrated circuits continue to progress, the size of every segment of a mask pattern is designed to be smaller. However, the exposure limit of every segment fabricated by exposure is limited to the resolution limit of the optical exposure tool used during the transfer step of the mask pattern. As light passes through the mask, it is refracted and scattered by the feature edges (chromium edges), thereby causing the projected image to show some roundings and other optical distortions. One problem that easily arises during the exposure of a mask pattern with high-density arranged segments to form a pattern on a photoresist is the optical proximity effect. Resolution losses occur because of overexposure or underexposure that induces deviations of the original pattern on the photoresist. Many saving methods have been used to improve the deviation caused by the optical proximity effect in order to improve the quality of the transferred pattern. The most popular method is the optical proximity correction (OPC). There has been a variety of commercial optical proximity correction softwares that can theoretically correct the mask pattern in order to obtain a more accurate pattern on a wafer. First, the digital pattern is evaluated with a software to identify regions where optical distortion will result. Then, the optical proximity correction is applied to compensate the distortion. The resulting pattern is ultimately transferred to the mask.

SUMMARY OF THE INVENTION

The present invention provides a method of performing optical proximity correction for preparing a mask projected onto a wafer by photolithography, which compensates an integrated circuit layout design including at least a feature overlapping a first boundary of two structures in the wafer by classifying the edge of the feature pertaining to specific trend sections of an experimental chart, and then evaluating an optical proximity correction value by a rule corresponding to the specific trend section.

The present invention provides a method of performing optical proximity correction for preparing a mask projected onto a wafer by photolithography including the following steps. An integrated circuit layout design including a first feature and a second feature is obtained, wherein the first feature overlaps a first boundary of two structures in the wafer. An edge of the first feature close to the second feature pertaining to a specific trend section of an experimental chart having trend sections is recognized. An optical proximity correction value is evaluated for the edge through a computer system by a rule corresponding to the specific trend section. The layout design is compensated with the optical proximity correction value.

According to the above, the present invention provides a method of performing optical proximity correction for preparing a mask projected onto a wafer by photolithography, which obtains an integrated circuit layout design including a first feature and a second feature, wherein the first feature overlaps a first boundary of two structures in the wafer; recognizing an edge of the first feature close to the second feature pertaining to a specific trend section of an experimental chart having trend sections; evaluating an optical proximity correction value for the edge through a computer system by a rule corresponding to the specific trend section; and compensating the layout design with the optical proximity correction value. Thus, a photoresist transferred by the mask overlapping the boundary of the two structures such as a shallow trench isolation structure and a substrate can be compensated by the method of performing optical proximity correction of the present invention.

These and other objectives of the present invention will no doubt become obvious to those of ordinary skill in the art after reading the following detailed description of the preferred embodiment that is illustrated in the various figures and drawings.

DETAILED DESCRIPTION

The method of performing optical proximity correction of the present invention is to prepare a mask, wherein the pattern of the mask will be transferred to a photoresist covering a wafer by carrying out a photolithography process. It is emphasized that the photoresist overlaps a boundary of two structures in the wafer, and the method of performing the optical proximity correction of the present invention is applied to compensate the distortion and the deviation occurring in these circumstances. Embodiments are presented as follows, but these embodiments are just some cases applying the present invention, which has photoresists overlap boundaries of structures in a wafer. The number of the photoresists, the boundaries and the relative positions of these photoresists and the boundaries are not limited to these embodiments, but depend on integrated circuit layouts and materials in wafers. In this embodiment, the two structures especially represent two structures with different materials because the optical proximity effect is obvious under this circumstance, but it is not limited thereto.

Figure 1:
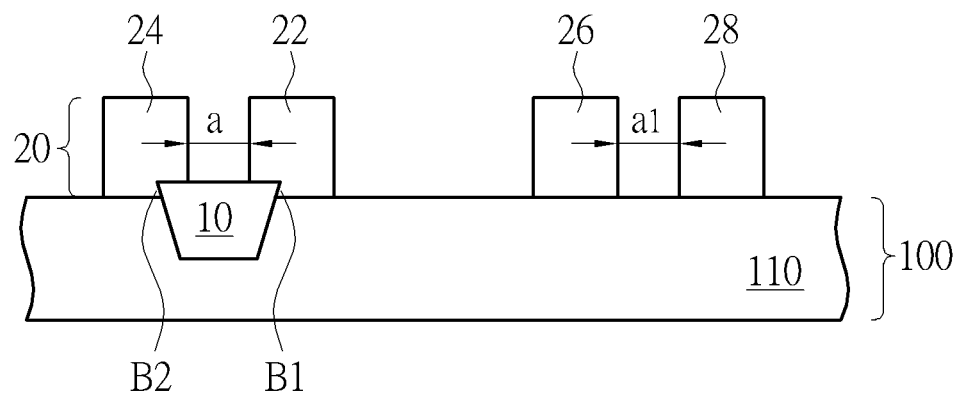
FIG. 1 schematically depicts a cross-sectional view of a photoresist and a wafer according to an embodiment of the present invention.

FIG. 1 schematically depicts a cross-sectional view of a photoresist and a wafer according to an embodiment of the present invention. In this embodiment, a wafer 100 is provided. The wafer 100 includes a substrate 110 and an isolation structure 10 embedded therein. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The isolation structure 10 may be a shallow trench isolation (STI) structure, which may formed through a shallow trench isolation (STI) process, but it is not limited thereto. A photoresist 20 is formed on the wafer 100, wherein the photoresist 20 may be coated and patterned through transferring a pattern of a mask (not shown). The photoresist 20 includes a first photoresist 22, a second photoresist 24, a third photoresist 26 and a fourth photoresist 28. The first photoresist 22 and the second photoresist 24 overlap a first boundary B1 of the substrate 110 and the isolation structure 10 and a second boundary B2 of the substrate 110 and the isolation structure 10 respectively. However, the optical proximity effect occurs and becomes serious when the first photoresist 22 and the second photoresist 24 overlap the first boundary B1 and the second boundary B2. In contrast, the third photoresist 26 and the fourth photoresist 28 are all disposed on the substrate 110, i.e. the third photoresist 26 and the fourth photoresist 28 are all disposed on the same material without overlapping boundaries. In this embodiment, the third photoresist 26 and the fourth photoresist 28 are all disposed on the substrate 110; in another embodiment, the third photoresist 26 and the fourth photoresist 28 may be all disposed on an isolation structure such as a shallow trench isolation structure, but it is not limited thereto. Thus, the critical dimension (CD) of the spacing "a" between the first photoresist 22 and the second photoresist 24 may be different from or equal to the critical dimension (CD) of the spacing "a1" between the third photoresist 26 and the fourth photoresist 28, depending upon practical circumstances.

Figure 2:
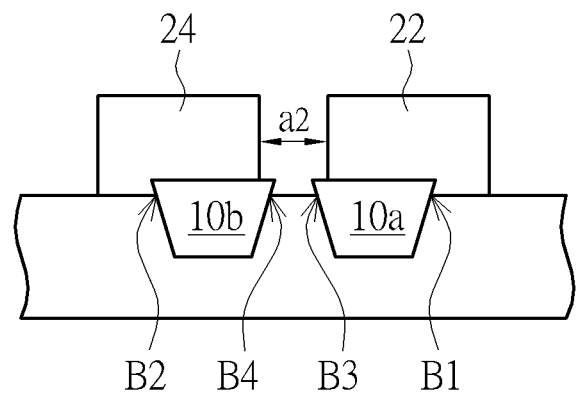
FIG. 2 schematically depicts a cross-sectional view of a photoresist and a wafer according to another embodiment of the present invention.

The number and the relative positions of the photoresist 20, the isolation structure 10 and the substrate 110 are not restricted thereto. FIG. 2 schematically depicts a cross-sectional view of a photoresist and a wafer according to another embodiment of the present invention. In this embodiment, the isolation structure 10 of FIG. 1 is replaced with a first isolation structure 10a and a second isolation structure 10b. Thus, there are a third boundary B3 and a fourth boundary B4 between the first photoresist 22 and the second photoresist 24 except for the first boundary B1 and the second boundary B2 overlapped by the first photoresist 22 and the second photoresist 24, causing serious light rounding and scattering when the photolithography is performed. As a result, the critical dimension (CD) of the spacing "a2" between the first photoresist 22 and the second photoresist 24 of FIG. 2 may be different from or equal to the critical dimension (CD) of the spacing "a" between the first photoresist 22 and the second photoresist 24 of FIG. 1. That is, the critical dimension (CD) of the spacing "a2" between the first photoresist 22 and the second photoresist 24 of FIG. 2 may be different from or equal to the critical dimension (CD) of the spacing "a1" between the third photoresist 26 and the fourth photoresist 28 of FIG. 1.

Even worse, photoresist residues may be generated between the first photoresist 22 and the second photoresist 24 in the embodiments of FIG. 1 and FIG. 2. According to the above, due to the optical distortion and the deviation caused by the photoresist 20 overlapping the boundaries of two structures such as the substrate 110 and the isolation structure 10, especially for a shallow trench isolation structure, a method of performing optical proximity correction of the present invention is provided as follows.

Figure 3:
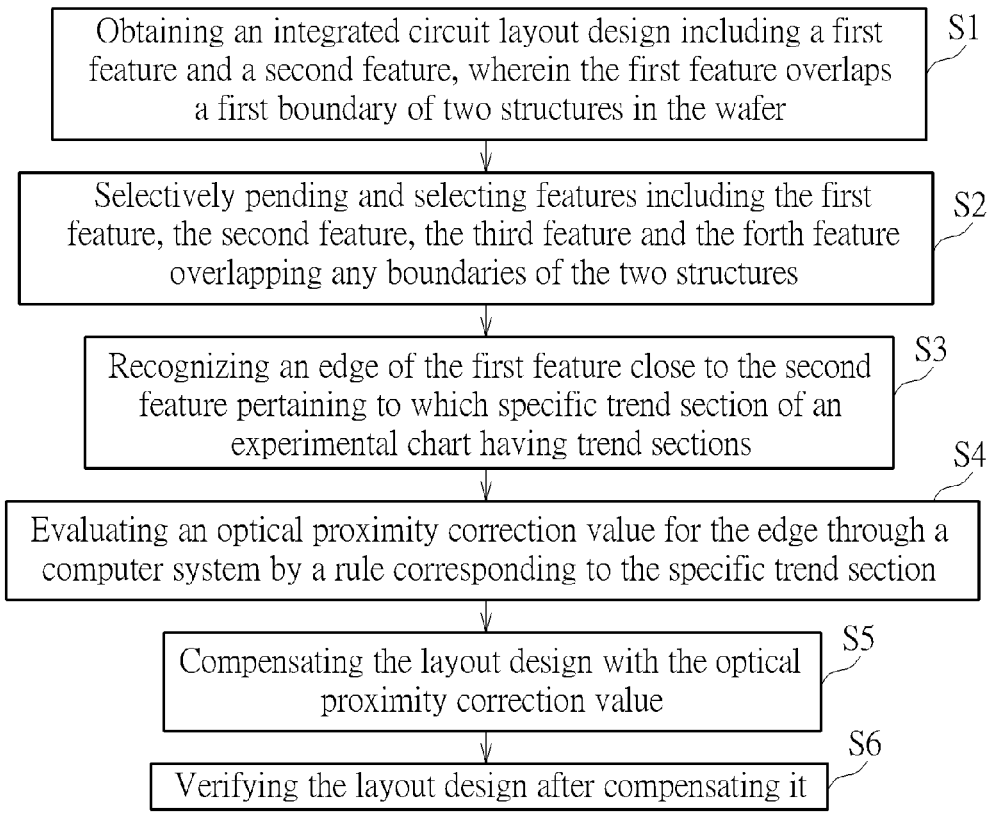
FIG. 3 schematically depicts a flow chart of a method of performing optical proximity correction for preparing a mask projected onto a wafer by photolithography according to an embodiment of the present invention.

FIG. 3 schematically depicts a flow chart of a method of performing optical proximity correction for preparing a mask projected onto a wafer by photolithography according to an embodiment of the present invention. Please refer to FIG. 3 paired with FIGS. 4-6 in the following embodiment.

As shown in FIG. 3, step S1—obtaining an integrated circuit layout design including a first feature and a second feature, wherein the first feature overlaps a first boundary of two structures in the wafer, is presented. Please refer to FIG. 4; an integrated circuit layout design 30 is obtained to produce a mask (not shown) for transferring a pattern to form the photoresist 20 overlapping the first boundary B1 and the second boundary B2 on the wafer 100 as shown in FIG. 1. The integrated circuit layout design 30 includes a first feature 32 and a second feature 34 adjusted to each other and a third feature 36 and a fourth feature 38 adjusted to each other. The first feature 32 corresponds to and is designed for forming the first photoresist 22, the second feature 34 corresponds to and is designed for forming the second photoresist 24, the third feature 36 corresponds to and is designed for forming the third photoresist 26 and the fourth feature 38 corresponds to and is designed for forming the fourth photoresist 28. Therefore, the first feature 32 should be designed while considering the optical proximity effect of overlapping the first boundary B1 of the substrate 110 and the isolation structure 10 in the wafer 110. In this embodiment, the second feature 34 overlaps the second boundary B2 of the isolation structure 10 and the substrate 110. Besides, the first feature 32 and the second feature 34 are parallel to each other, but it is not limited thereto. Thus, the optical deviation and distortion occurs because of the first boundary B1 and the second boundary B2.

In another case, the isolation structure 10 may extend to the second photoresist 24 and be large enough to enable the second photoresist 24 to be entirely located thereon without overlapping the second boundary B2. Thus, the optical deviation and distortion occurring in this embodiment would be only caused by the first boundary B1. The method of performing optical proximity correction of the present invention can solve the optical deviation and distortion under all of said circumstances.

Then, according to a selective Step 2 of FIG. 3—selectively pending and selecting features including the first feature, the second feature, the third feature and the fourth feature overlapping any boundaries of the two structures. Since the first feature 32 and the second feature 34 overlap the first boundary B1 and the second boundary B2 while the third feature 36 and the fourth feature 38 are all disposed on the substrate 110, the optical proximity effect occurring to the first feature 32 and the second feature 34 is much more obvious than the one occurring to the third feature 36 and the fourth feature 38. In some cases, the optical proximity correction compensating the first feature 32 and the second feature 34 may be an addition of the optical proximity correction compensating the third feature 36 and the fourth feature 38 and the optical proximity correction caused by the first boundary B1 and the second boundary B2. Thus, the first feature 32 and the second feature 34 are selected in the step S2 because they overlap the first boundary B1 and the second boundary B2. FIG. 5, which depicts the part including the first feature 32 and the second feature 34 of FIG. 4, is presented for clarifying and simplifying the present invention.

Figure 4:
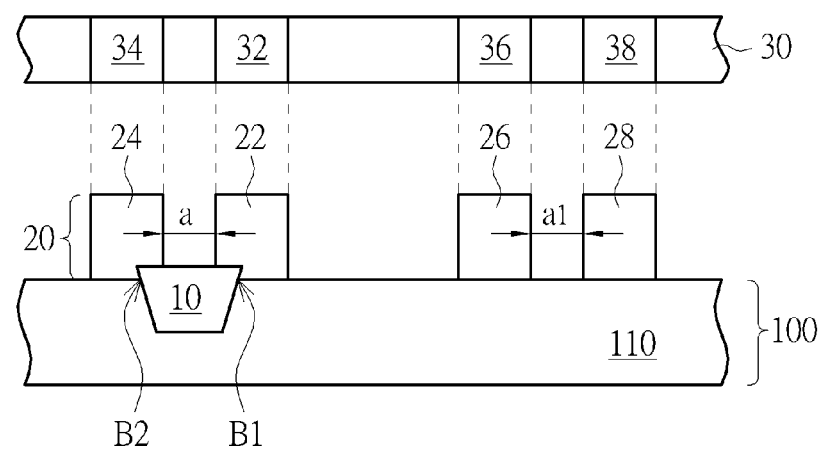
FIG. 4 schematically depicts a cross-sectional view of a photoresist and a wafer paired with a corresponding integrated circuit layout design according to an embodiment of the present invention.
Figure 5:
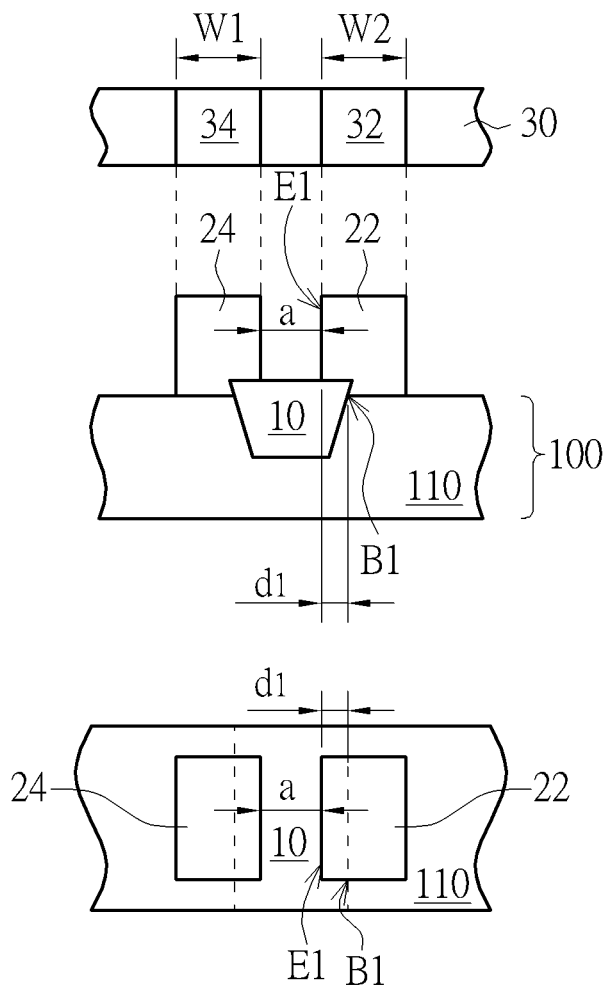
FIG. 5 schematically depicts a top view and a cross-sectional view of a partial diagram of FIG. 4.
Figure 6:
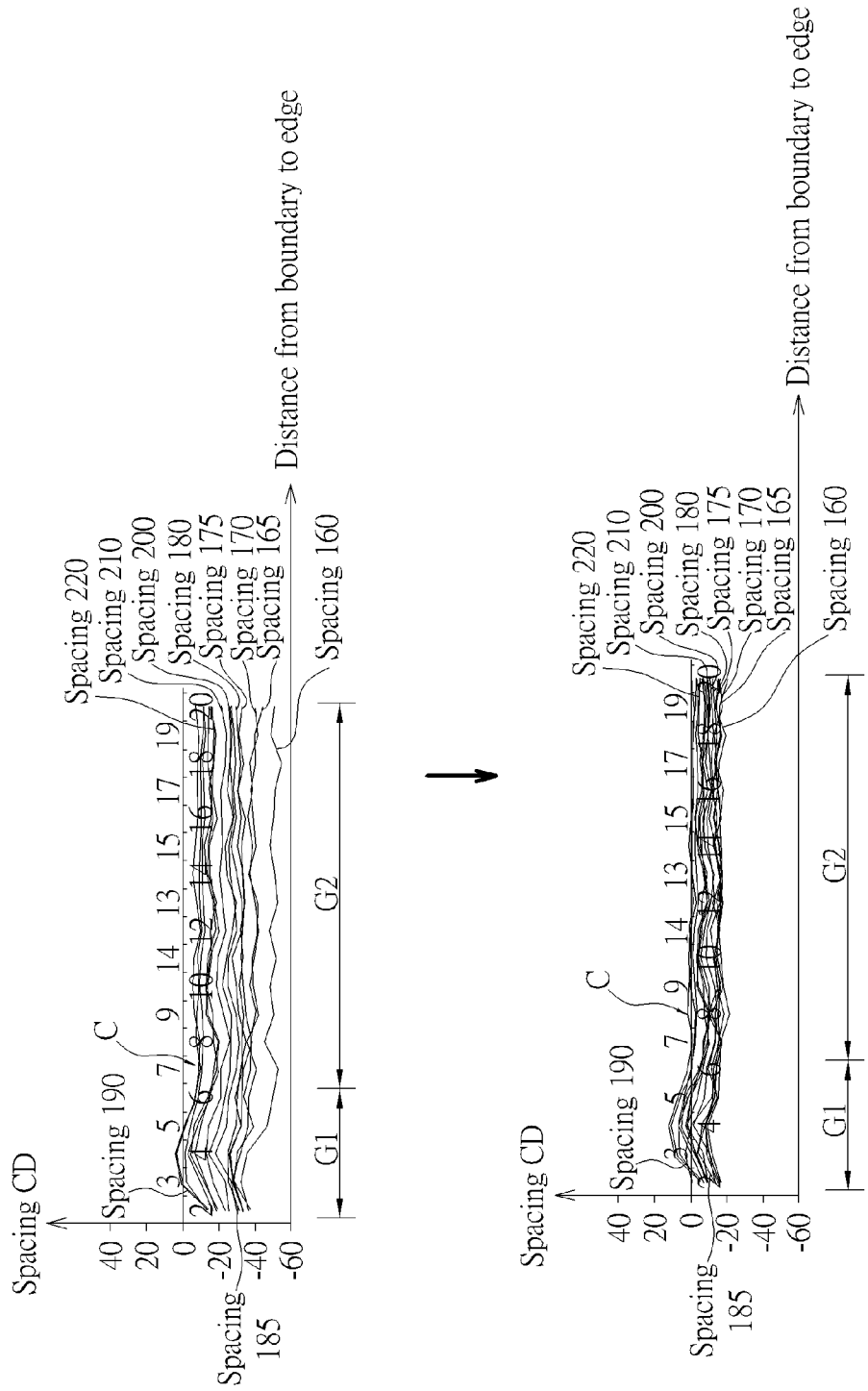
FIG. 6 schematically depicts an experimental chart having curves of critical dimension of spacing between the first feature and the second feature versus the distance between the boundary and the edge according to an embodiment before and after applying the present invention.

FIG. 5 schematically depicts a top view and a cross-sectional view of a partial diagram of FIG. 4. FIG. 6 schematically depicts an experimental chart having curves of the critical dimension of a spacing between the first feature and the second feature versus the distance between the boundary and the edge according to an embodiment before and after applying the present invention, wherein the top part represents an embodiment before applying the present invention while the bottom part represents an embodiment desired to be approached after applying the present invention. According to Step S3 of FIG. 3—recognizing an edge of the first feature close to the second feature pertaining to a specific trend section of an experimental chart having trend sections, as shown in FIGS. 5-6, the experimental chart has curves C of the critical dimension of a spacing "a" between the first feature 32 and the second feature 34 versus the distance "d1" between the first boundary B1 and the edge E1 of the first feature 32 (or the edge E2 of the first photoresist 22) based on various spacings "a". This means that each curve C is based on one spacing "a". The curves C can be classified into several trend sections, wherein the trend sections may include a first trend section G1 and a second trend section G2 in accordance with the trends of curves C. The first trend section G1 corresponds to a distance between the first boundary B1 and the edge E1 shorter than that of the second trend section G2. The first trend section G1 includes parts of curves C with more complex curvatures than ones of the second trend section G2. Thus, the optical proximity correction value compensating the integrated circuit layout can be obtained easily and effectively when recognizing the edge E1 of the first feature 32 pertaining to one of the first trend section G1 and the second trend section G2.

Then, according to Step S4 of FIG. 3—evaluating an optical proximity correction value for the edge through a computer system by a rule corresponding to the specific trend section, in one case, when the edge E1 of the first feature 32 pertains to a second trend section, the rule for evaluating the optical proximity correction value for the edge E1 is to re-target the layout design. In one case, the rule of re-targeting the layout design may include increasing a width w1 of the first feature 32 and decreasing the spacing "a" between the first feature 32 and the second feature 34. For example, when an integrated circuit layout design 30 is desired to have the first photoresist 22 achieving the width w1 of 110 angstroms and the spacing "a" of 70 angstroms, the width w1 of the first feature 32 may be adjusted to 120 angstroms and the spacing "a" between the first feature 32 and the second feature 34 may be first adjusted to 60 angstroms according to the rule of re-targeting the layout design. It is noted that the width w1 plus the spacing "a" is kept the same while performing the rule of re-targeting the layout design. This means that the increased value of the width w1 is the same as the decreased value of the spacing "a". Moreover, a rule of base optical proximity correction may then be selectively performed to carry out the evaluation of an optical proximity correction value. The rule of the base optical proximity correction may be a form of edge offset for further compensating the distortion of the edge E1, but it is not limited thereto.

In another case, when the edge E1 of the first feature 32 pertains to the first trend section G1, the rule of evaluating the optical proximity correction value for the edge E1 includes re-targeting the layout design and then modeling the layout design. In one case, the rule of re-targeting the layout design may include increasing the width w1 of the first feature 32 34 and decreasing the spacing "a" between the first feature 32 and the second feature 34. It is noted that, the width w1 plus the spacing "a" is kept the same while performing the rule of re-targeting the layout design. This means that the increased value of the width w1 is the same as the decreased value of the spacing "a".

Then, a rule of modeling the layout design is performed to carry out the evaluation of an optical proximity correction value. In one embodiment, the rule of modeling the layout design may include a formula of a forecast mask:

$$\text{forecast Mask CD}(c) = \{\text{mask}(b) + (\text{mask}(a) - \text{mask}(b))/(\text{wafer}(a) - \text{wafer}(b)) \times [\text{target}(c) - \text{wafer}(b)]\} \times \text{factor}(E)$$

mask (a or b): the critical dimension of Mask A or B
wafer (a or b): the critical dimension of Mask A or B on the wafer
target (c): the critical dimension of Mask C on the wafer
factor (E): one factor relative to the effect of photoresists, substrates, optical conditions
forecast mask CD (c): calculates the critical dimension of Mask C corresponding to the critical dimension of Mask C on the wafer Specifically, a mask A having a critical dimension of mask (a) and a Mask B having a critical dimension of mask (b) are previously provided without considering the effect of the overlapping boundaries. Besides, the critical dimension of the Mask A including considerations of the effect of the overlapping boundaries being wafer (a) while the critical dimension of the Mask B including considerations of the effect of the overlapping boundaries being wafer (b) are already obtained. So, when a mask C approaching the critical dimension of wafer (c) (meaning the same as target (c)) is prepared under the considerations of the effect of overlapping boundaries, the critical dimension of the mask C, i.e. forecast mask (c), can be calculated by the formula of the forecast mask. Furthermore, the factor (E) may be multiplied to obtain the forecast mask (c) to further compensate other effects such as photoresists, substrates, optical conditions occurring under practical circumstances.

In another embodiment, the rule of modeling the layout design may include a form of correcting bias.

If spacing a2>a>a1 then
   If d1-2>distance≥d1-1 then bias=v1
   If d1-3>distance≥d1-2 then bias=v2
   If d1-4>distance≥d1-3 then bias=v3

The form of the correcting bias is an approximation rule of the formula of the forecast mask. The spacing a2, the spacing a1, the distance d1-2, the distance d1-1, the distance d1-3 and the distance d1-4 are constant values for classifying and simplifying the formula of the forecast mask. When the spacing "a" is comprised in a range of spacing a2>a>a1 and then the distance d1 is comprised in a range of distance d1-2>d1>=d1-1, a bias v1 is performed for compensation; when the spacing "a" is comprised in a range of spacing a2>a>a1 and then the distance d1 falls in a range of distance d1-3>d1>=d1-2, a bias v2 is performed for compensation; and so on.

Although the experimental chart of FIG. 6 includes the curves C of the critical dimension of the spacing "a" between the first feature 32 and the second feature 34 versus the distance d1 between the first boundary B1 and the edge E1 of the first feature 32, this is just one way to compensate the integrated circuit design layout. In addition, the experimental chart may include other curves in accordance with parameters such as the relative positions of the substrate 110, the isolation structure 10 and the photoresist 20 (or the features 32, 34), the spacing between these structures, the critical dimension of the spacing, etc, through experimental data. In general, the critical dimension of the spacing "a" is related to the width of the features, the spacing between the features, the length of the features and the distance between the boundaries of the structures in a wafer and the edges of the features, so these parameters may be under consideration while evaluating the optical proximity correction value of the features. Then, the experimental chart can be classified into several trend sections or several groups by some rules. Thus, the features of an integrated circuit layout can be recognized as belonging to a specific trend section from these trend sections or groups, so an optical proximity correction value can be evaluated by the rule corresponding to the specific trend section.

Then, according to Step S5 of FIG. 3—compensating the layout design with the optical proximity correction value, in this embodiment, the part of the layout design including the first feature and the second feature can be compensated with the optical proximity correction value evaluated above while the other part of the layout design including the third feature and the fourth feature may be selectively compensated with another optical proximity correction value according to another experimental chart. In another embodiment, the part of the layout design including the first feature and the second feature may be compensated with the optical proximity correction value evaluated above firstly, and then the part of the layout design including the first feature and the second feature may be compensated again together with the other part of the layout design including the third feature and the fourth feature with another optical proximity correction value according to another experimental chart, which may be induced by parameters through experimental data.

Thereafter, according to Step S6 of FIG. 3—verifying the layout design after compensating it.

To summarize, the present invention provides a method of performing optical proximity correction for preparing a mask projected onto a wafer by photolithography, which obtains an integrated circuit layout design including a first feature and a second feature, wherein the first feature overlaps a first boundary of two structures in the wafer; recognizing an edge of the first feature close to the second feature pertaining to a specific trend section of an experimental chart having trend sections; evaluating an optical proximity correction value for the edge through a computer system by a rule corresponding to the specific trend section; and compensating the layout design with the optical proximity correction value. Thus, a photoresist overlapping at least a boundary of two structures can be compensated by the method of performing optical proximity correction of the present invention. More precisely, the two structures represent a shallow trench isolation structure and a substrate.

Furthermore, the experimental chart may be classified into a first trend section and a second trend section. The rule corresponding to the second trend section may include re-targeting the layout design. The rule corresponding to the first trend section may include re-targeting the layout design and then modeling the layout design. The rule of re-targeting the layout design may be related to the modification of a spacing between a first feature and a second feature and a total width of the first feature and the second feature. The rule of modeling the layout design may include a formula of a forecast mask or a form of a correcting bias.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing optical proximity correction for preparing a mask projected onto a wafer by photolithography, comprising:
   obtaining an integrated circuit layout design comprising a first feature and a second feature, wherein the first feature overlaps a first boundary of two structures in the wafer,
   recognizing an edge of the first feature close to the second feature pertaining to a specific trend section of an experimental chart having trend sections,
   evaluating an optical proximity correction value for the edge through a computer system by a rule corresponding to the specific trend section, and
   compensating the layout design with the optical proximity correction value.

2. The method of performing optical proximity correction for preparing a mask projected onto a wafer by photolithography according to claim 1, wherein the two structures comprise different materials.

3. The method of performing optical proximity correction for preparing a mask projected onto a wafer by photolithography according to claim 2, wherein the two structures comprise a shallow trench isolation structure and a substrate.

4. The method of performing optical proximity correction for preparing a mask projected onto a wafer by photolithography according to claim 3, wherein the shallow trench isolation structure is embedded in the substrate.

5. The method of performing optical proximity correction for preparing a mask projected onto a wafer by photolithography according to claim 4, wherein the first feature overlaps the first boundary of the shallow trench isolation structure and the substrate while the second feature overlaps a second boundary of the shallow trench isolation structure and the substrate.

6. The method of performing optical proximity correction for preparing a mask projected onto a wafer by photolithography according to claim 1, wherein the first feature and the second feature are parallel to each other.

7. The method of performing optical proximity correction for preparing a mask projected onto a wafer by photolithography according to claim 1, wherein the trend sections are classified by the distance between the first boundary and the edge.

8. The method of performing optical proximity correction for preparing a mask projected onto a wafer by photolithography according to claim 7, wherein the experimental chart has curves of critical dimensions of a spacing between the first feature and the second feature versus the distance between the first boundary and the edge.

9. The method of performing optical proximity correction for preparing a mask projected onto a wafer by photolithography according to claim 7, wherein the trend sections comprise a first trend section and a second trend section.

10. The method of performing optical proximity correction for preparing a mask projected onto a wafer by photolithography according to claim 9, wherein the first trend section corresponds to shorter distances between the first boundary and the edge than those of the second trend section.

11. The method of performing optical proximity correction according to claim 10, wherein the rule is re-targeting the layout design when the specific trend section is the second trend section.

12. The method of performing optical proximity correction for preparing a mask projected onto a wafer by photolithography according to claim 11, wherein the rule of re-targeting the layout design comprises increasing a width of the first feature and decreasing the spacing between the first feature and the second feature.

13. The method of performing optical proximity correction for preparing a mask projected onto a wafer by photolithography according to claim 12, wherein the increased value of the width is the same as the decreased value of the spacing.

14. The method of performing optical proximity correction for preparing a mask projected onto a wafer by photolithography according to claim 9, wherein the rule is re-targeting the layout design and then modeling the layout design when the specific trend section is the first trend section.

15. The method of performing optical proximity correction for preparing a mask projected onto a wafer by photolithography according to claim 14, wherein the rule of re-targeting the layout design comprises increasing a width of the first feature and decreasing the spacing between the first feature and the second feature.

16. The method of performing optical proximity correction for preparing a mask projected onto a wafer by photolithography according to claim 15, wherein the increased value of the width is the same as the decreased value of the spacing.

17. The method of performing optical proximity correction for preparing a mask projected onto a wafer by photolithography according to claim 14, wherein the rule of modeling the layout design comprises a formula of a forecast mask.

18. The method of performing optical proximity correction for preparing a mask projected onto a wafer by photolithography according to claim 14, wherein the rule of modeling the layout design comprises a form of correcting bias.

19. The method of performing optical proximity correction for preparing a mask projected onto a wafer by photolithography according to claim 1, further comprising:
verifying the layout design after compensating the layout design.

20. The method of performing optical proximity correction for preparing a mask projected onto a wafer by photolithography according to claim 1, wherein the integrated circuit layout design further comprises a third feature and a fourth feature all located in one of the two structures, and the method of performing optical proximity correction further comprises:
selecting features comprising the first feature, the second feature, the third feature and the fourth feature overlapping any boundaries of the two structures before the edge of the first feature is recognized.

21. A method of performing optical proximity correction for preparing a mask projected onto a wafer by photolithography, comprising:
obtaining an integrated circuit layout design comprising a first feature and a second feature, wherein the first feature overlaps a first boundary of two structures in the wafer;
recognizing an edge of the first feature close to the second feature pertaining to a specific trend section of an experimental chart having trend sections, wherein the trend sections are classified by the distance between the first boundary and the edge;
evaluating an optical proximity correction value for the edge through a computer system by a rule corresponding to the specific trend section; and
compensating the layout design with the optical proximity correction value.

22. A method of performing optical proximity correction for preparing a mask projected onto a wafer by photolithography, comprising:
obtaining an integrated circuit layout design comprising a first feature and a second feature, wherein the first feature overlaps a first boundary of two structures in the wafer and the two structures comprise a shallow trench isolation structure and a substrate;
recognizing an edge of the first feature close to the second feature pertaining to a specific trend section of an experimental chart having trend sections;
evaluating an optical proximity correction value for the edge through a computer system by a rule corresponding to the specific trend section; and
compensating the layout design with the optical proximity correction value.

* * * * *